(12) United States Patent
Chen et al.

(10) Patent No.: US 11,394,303 B2
(45) Date of Patent: Jul. 19, 2022

(54) FLYBACK CONVERTER WITH SYNCHRONOUS RECTIFIER SWITCH FAULT DETECTION

(71) Applicant: DIALOG SEMICONDUCTOR INC., Campbell, CA (US)

(72) Inventors: Yimin Chen, Campbell, CA (US); Juyoung Yoon, Campbell, CA (US); Jiandong Zhang, Campbell, CA (US); David Nguyen, Campbell, CA (US); Jianming Yao, Campbell, CA (US)

(73) Assignee: Dialog Semiconductor, Inc., Campbell, CA (US)

( * ) Notice: Subject to any disclaimer, the term of this patent is extended or adjusted under 35 U.S.C. 154(b) by 62 days.

(21) Appl. No.: 16/888,021

(22) Filed: May 29, 2020

(65) Prior Publication Data
US 2021/0376712 A1 Dec. 2, 2021

(51) Int. Cl.
*H02M 3/335* (2006.01)
*H02M 1/08* (2006.01)
*H02M 1/36* (2007.01)
*H02M 1/32* (2007.01)
*H03K 5/24* (2006.01)

(52) U.S. Cl.
CPC ............ *H02M 3/335* (2013.01); *H02M 1/08* (2013.01); *H02M 3/33507* (2013.01); *H02M 3/33592* (2013.01); *H02M 1/32* (2013.01); *H02M 1/36* (2013.01); *H03K 5/24* (2013.01)

(58) Field of Classification Search
CPC ...... H02M 1/36; H02M 1/32; H02M 3/33515; H02M 3/33576; H02M 3/33592
See application file for complete search history.

(56) References Cited

U.S. PATENT DOCUMENTS

| | | | |
|---|---|---|---|
| 2001/0000647 A1* | 5/2001 | Akram | G01R 1/0483 324/750.03 |
| 2010/0060175 A1* | 3/2010 | Lethellier | H05B 47/105 315/164 |
| 2010/0208502 A1* | 8/2010 | Horii | H02M 3/33507 363/131 |
| 2014/0334205 A1* | 11/2014 | Zhang | H05B 45/382 363/89 |
| 2015/0372601 A1* | 12/2015 | Shiu | H02M 1/32 363/21.12 |
| 2016/0079790 A1* | 3/2016 | Kleinpenning | H02M 3/1588 320/107 |
| 2016/0261204 A1* | 9/2016 | Kikuchi | H02M 3/33592 |
| 2016/0294180 A1* | 10/2016 | Pagano | H02H 3/20 |
| 2018/0006569 A1* | 1/2018 | Kikuchi | G05F 1/618 |
| 2018/0062510 A1* | 3/2018 | Trescases | H03K 17/284 |
| 2018/0138797 A1* | 5/2018 | Tsu | H02M 1/08 |

(Continued)

*Primary Examiner* — Gustavo A Rosario-Benitez
(74) *Attorney, Agent, or Firm* — Haynes and Boone, LLP (57) ABSTRACT

A flyback converter is provided that compares a drain-to-source voltage of a synchronous rectifier switch transistor to a negative threshold voltage to detect whether the synchronous rectifier switch transistor has a partially-open or an open fault condition. The flyback converter also compares a gate terminal voltage of a gate driver to the synchronous rectifier switch transistor to a positive threshold voltage to detect whether the synchronous rectifier switch transistor has a gate open or a gate short-circuit fault condition.

20 Claims, 5 Drawing Sheets

(56) References Cited

U.S. PATENT DOCUMENTS

| | | | |
|---|---|---|---|
| 2018/0175738 A1* | 6/2018 | Kikuchi | H02J 1/102 |
| 2018/0351462 A1* | 12/2018 | Li | H02M 3/33507 |
| 2018/0367045 A1* | 12/2018 | Zhang | H02M 3/33523 |
| 2019/0149056 A1* | 5/2019 | Zheng | H02J 7/00 |
| | | | 363/21.13 |
| 2019/0222132 A1* | 7/2019 | Kikuchi | H02M 3/33592 |
| 2019/0229635 A1* | 7/2019 | Hyugaji | H02M 1/32 |
| 2019/0326903 A1* | 10/2019 | Yoshida | H02M 1/08 |
| 2020/0112264 A1* | 4/2020 | Arima | H02H 7/1213 |
| 2021/0091654 A1* | 3/2021 | Rajesh | H02M 3/33523 |

\* cited by examiner

FLYBACK CONVERTER WITH SYNCHRONOUS RECTIFIER SWITCH FAULT DETECTION

TECHNICAL FIELD

This application relates to switching power converters, and more particularly to flyback converters with synchronous rectifier switch fault detection.

BACKGROUND

As known in the flyback arts, a secondary-winding current in a flyback converter's transformer is rectified so as to not conduct while the primary-winding current conducts. This rectification may be performed by an output diode or by a synchronous rectifier switch transistor. Although an output diode is passive and thus requires no synchronous rectifier control, the use of an output diode lowers efficiency as compared to a flyback converter with synchronous rectification. Synchronous rectification is thus broadly used to improve efficiency.

The synchronous rectifier switch transistor is typically a metal-oxide-semiconductor field-effect transistor (MOSFET). To control the switching of a synchronous rectifier (SR) switch MOSFET, an SR controller monitors the drain-to-source voltage across the SR MOSFET. Based upon the drain-to-source voltage, the SR controller detects whether the power switch transistor has cycled off so that the SR MOSFET may be switched on. For example, if the SR MOSFET is an n-type metal-oxide semiconductor (NMOS) transistor, the SR controller switches on the SR MOSFET by increasing a gate-to-source voltage for the SR MOSFET above its threshold voltage.

But like any semiconductor device, the SR switch transistor is subject to manufacturing defects. For example, the SR switch transistor may be only slightly on (a partially-open fault condition) or off (an open fault condition) despite its threshold voltage being satisfied. In addition, to such partially-open or fully-open fault conditions, the gate of the SR switch transistor may be shorted to ground (a gate-to-ground short-circuit fault condition) or shorted to the source of the SR switch transistor (a gate-to-source short-circuit fault condition).

As a result of these fault conditions, the drain current that would ordinarily conduct through the channel of the SR switch transistor instead conducts through its body diode. The conduction through the body diode instead of the channel results in a relatively-high drain-to-source voltage across the SR switch transistor, which causes thermal stress to the power supply. The detection of an open fault condition, a partially-open fault condition, a gate-to-ground short-circuit fault condition, and a gate-to-source short-circuit fault condition is thus critical to the power supply reliability. Despite this criticality, existing fault condition techniques typically cannot detect the partially-open fault condition.

In a conventional SR switch transistor fault detection, a current source is applied to the gate of the SR switch transistor while a rate of change (dV/dt) for the drain-to-source voltage (Vds) across the SR switch transistor is detected to determine the gate-to-source capacitance for the SR switch transistor. If the gate-to-source capacitance is less than a first threshold amount, a gate open fault is deemed to be detected. Conversely, if the gate-to-source capacitance is higher than a second threshold amount, a gate-to-source short-circuit fault condition is deemed to be detected. The resulting conventional fault detection is only applicable during a start-up stage and cannot detect a partially-open fault condition, which is problematic with regard to ensuring reliability of the flyback converter.

Accordingly, there is a need in the art for flyback converters with improved fault detection for the operation of the synchronous rectifier switch transistor.

SUMMARY

In accordance with a first aspect of the disclosure, a secondary-side controller for a flyback converter is provided that includes: a gate driver for controlling a cycling of a synchronous rectifier switch transistor; a drain terminal for connecting to a drain of the synchronous rectifier switch transistor; a timer for timing a detection period beginning when the gate driver switches on the synchronous rectifier switch transistor and ending when a voltage of the drain terminal exceeds a negative voltage threshold; and a logic circuit configured to compare the detection period to a threshold period to detect whether the synchronous rectifier switch transistor has a partially-open fault condition or an open fault condition.

In accordance with a second aspect of the disclosure, a secondary-side controller for a flyback converter is provided that includes: a gate driver for controlling a cycling of a synchronous rectifier switch transistor through a gate terminal; a timer for timing a detection period beginning when the gate driver switches on the synchronous rectifier switch transistor and ending when a voltage of the gate terminal exceeds a positive threshold voltage; and a logic circuit configured to detect whether the synchronous rectifier switch transistor has a gate open fault condition responsive to the detection period being shorter than a first threshold period.

In accordance with a third aspect of the disclosure, a method of detecting a fault condition for a synchronous rectifier switch transistor in a flyback converter is provided that includes: switching on the synchronous rectifier switch transistor; while the synchronous rectifier switch transistor is on, beginning a timing of a first detection period responsive to a drain-to-source voltage of the synchronous rectifier switch transistor being greater than a negative threshold voltage; ending the timing of the first detection period responsive to switching off of the synchronous rectifier switch transistor; and detecting a partially-open fault condition for the synchronous rectifier switch transistor responsive to the first detection period being shorter than a first threshold period.

These and other aspects of the invention will become more fully understood upon a review of the detailed description, which follows. Other aspects, features, and embodiments will become apparent to those of ordinary skill in the art, upon reviewing the following description of specific, exemplary embodiments in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Flyback converters are provided in which a secondary-side controller monitors the drain-to-source voltage (Vds) of the SR switch transistor while the SR switch transistor is cycled to detect both open fault conditions and partially-open fault conditions. The following discussion will be directed to embodiments in which the secondary-side controller is also the SR switch controller but it will be appreciated that the SR switch transistor fault monitoring and the SR switch control may be implemented in separate integrated circuits. An open fault condition occurs when the drain current for the SR switch transistor conducts entirely through the body diode such that the channel is closed (non-conducting). In contrast, the channel conducts some current in a partially-open fault condition such that the drain current is split between the partially-closed channel and the body diode. In addition, flyback converters are provided in which the secondary-side controller monitors a gate driver voltage that controls the SR switch transistor to detect a gate open fault condition or a gate short-circuit fault condition. A gate short-circuit fault condition may be caused by a gate-to-ground short circuit or a gate-to-source short circuit.

Figure 1:
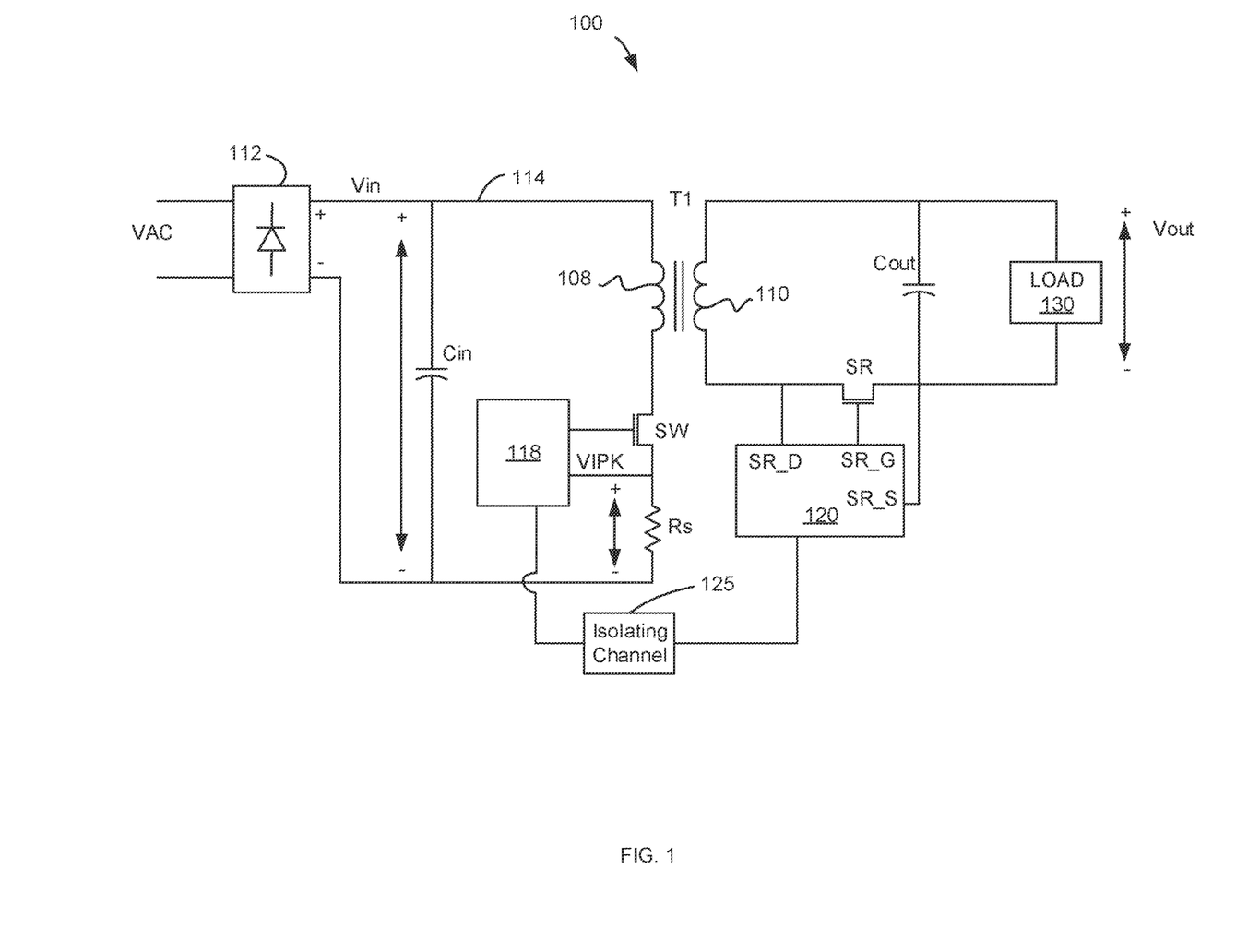
FIG. 1 illustrates a flyback converter including a secondary-side controller configured to detect synchronous rectifier switch transistor fault conditions including a partially-open fault condition, an open fault condition, a gate open fault condition, and a gate short-circuit fault condition in accordance with an aspect of the disclosure.

Turning now to the drawings, a flyback converter 100 with a fault-monitoring secondary-side SR controller 120 is shown in FIG. 1. Flyback converter 100 is powered by a rectified input voltage Vin such as produced by a diode bridge 112 that rectifies an AC voltage VAC from an AC mains. The input voltage Vin is carried on an input rail 114 and supported by an input capacitor Cin that couples between input rail 114 and a primary-side ground. A primary-side controller 118 controls the cycling of a power switch transistor SW to regulate an output voltage Vout supplied to a load 130. When primary-side controller 118 switches on the power switch transistor SW, a primary-winding current conducts through a primary winding 108 of a transformer T1. A sense resistor Rs connects between a drain of the power switch transistor SW and the primary-side ground. The primary-winding current thus flows through the sense resistor Rs and develops a sense resistor voltage across the sense resistor Rs that is sensed by primary-side controller 118. When the sense resistor voltage reaches a desired peak (Vipk), primary-side controller 118 switches off the power switch transistor SW.

SR controller 120 detects whether the power switch transistor SW is on or off by monitoring a drain-to-source voltage Vds across an SR switch transistor. To perform this monitoring, SR controller 120 has a drain monitoring terminal SR_D and a source monitoring terminal SR_S. In addition, SR controller 120 includes a gate terminal SR_G that connects to a gate of the SR switch transistor to control whether the SR switch transistor is on or off. In response to detecting that the power switch transistor SW is on, SR controller 120 maintains the SR switch transistor off to prevent a secondary-winding current from flowing in a secondary winding 110 of the transformer T1. In response to detecting that the power switch transistor SW is off, SR controller 120 switches on the SR switch transistor to let the secondary-winding current flow and charge an output capacitor Cout with the output voltage. Rather than monitor the drain-to-source voltage of the SR switch transistor to determine the switching state of the power switch transistor, SR controller 120 may instead receive a switch on or off status for the power switch transistor SW through an isolating channel 125 such as an optocoupler in alternative embodiments.

The faulting monitoring by SR controller 120 of fault conditions for the SR switch transistor will now be discussed in more detail. The drain-to-source voltage monitoring to detect open or partially-open fault conditions will be discussed first followed by a discussion of the gate driver voltage monitoring to detect the gate open or gate short-circuit fault conditions. The drain-to-source voltage monitoring features of SR controller 120 are shown in more detail in FIG. 2. Since the source voltage of the SR switch transistor is a secondary-side ground, SR controller 120 may monitor the drain-to-source voltage of the SR switch transistor by monitoring the drain voltage as received through its drain monitoring terminal SR_D. Note that a partially-open fault condition or an open fault condition for the SR switch transistor causes the drain-to-source voltage to be significantly more negative than normal while the SR switch transistor is on due to the conduction through the SR switch transistor's body diode. SR controller 120 advantageously exploits this negative behavior of the drain-to-source voltage through the inclusion of a comparator 205 that compares the drain voltage to a negative threshold voltage. In some embodiments, the negative threshold voltage should be lower than the body diode drop at higher operating temperatures but higher than the drain-to-source resistance-caused drop in the drain-to-source voltage at these higher operating temperatures. Since both these drops have a positive coefficient with respect to temperature increases, a threshold adaptation circuit 235 may adaptively lower the negative threshold voltage at higher operating temperatures. In the following discussion, it will be assumed that a default value for the negative threshold voltage is −280 mV but it will be appreciated that the default value and any adaptation of this default value will depend upon the particular semiconductor process node used to manufacture the SR switch transistor. In some embodiments, the SR switch transistor is a discrete device that is not integrated with the integrated circuit that includes SR controller 120.

Figure 2:
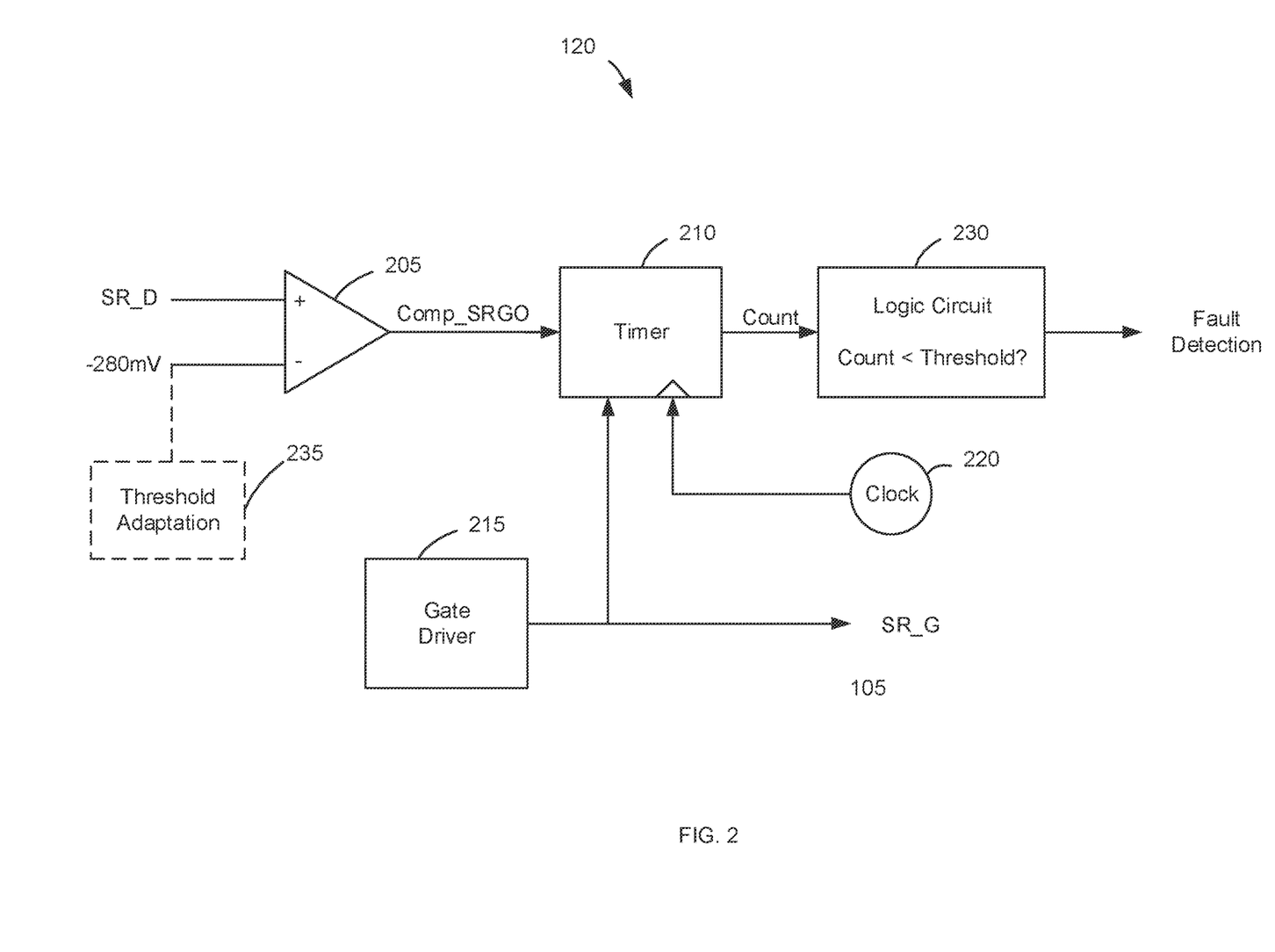
FIG. 2 illustrates the drain-to-source voltage monitoring features of the secondary-side controller of FIG. 1 for the detection of the partially-open and open fault conditions in accordance with an aspect of the disclosure.

Comparator 205 receives the drain voltage at its non-inverting input such that comparator 205 will charge its output signal (designated as Comp_SRGO) to a power supply voltage in response to the drain-to-source voltage being greater than the negative threshold voltage. However, it will be appreciated that in alternative embodiments, comparator 205 may be in an active-low configuration such that the drain voltage is received at its inverting input. As used herein, a binary signal such as a comparator output signal is deemed to be asserted if the binary signal is true, regardless of whether the comparator is in an active-high or active-low configuration.

A timer 210 begins counting cycles of a clock signal from a clock 220 in response to the assertion of the comparator output signal Comp_SRGO to begin timing a detection period T. Timer 210 stops counting for the detection period T when a gate driver 215 switches off the SR switch transistor. In an NMOS embodiment, gate driver 215 discharges the gate terminal SR_G to ground to switch off the SR switch transistor. Timer 210 responds to the discharge of the gate terminal SR_G by stopping the counting. A logic circuit 230 then examines a resulting count from counter 210 to detect the partially-open and open fault conditions. In particular, a partially-open fault condition or an open fault condition for the SW switch transistor is deemed to be detected when logic circuit 230 determines that the count (the detection period T) is less than a threshold count. A partially-open or open fault condition is thus detected in response to the detection period T being less that a threshold period. In alternative embodiments, the timing of the detection period T may be performed using analog circuits rather than through timer 210. For example, a current source may be configured to charge a capacitor according to an RC time constant in response to the assertion of the comparator output signal Comp_SRGO. The current source would then stop charging the capacitor in response to gate driver 215 switching off the SR switch transistor. The resulting voltage on the capacitor is thus proportional to the detection period T during which the capacitor was charged. The analog timing of detection period T is thus analogous to the timing by counter 210 except that it was performed in the analog domain.

Figure 3A:
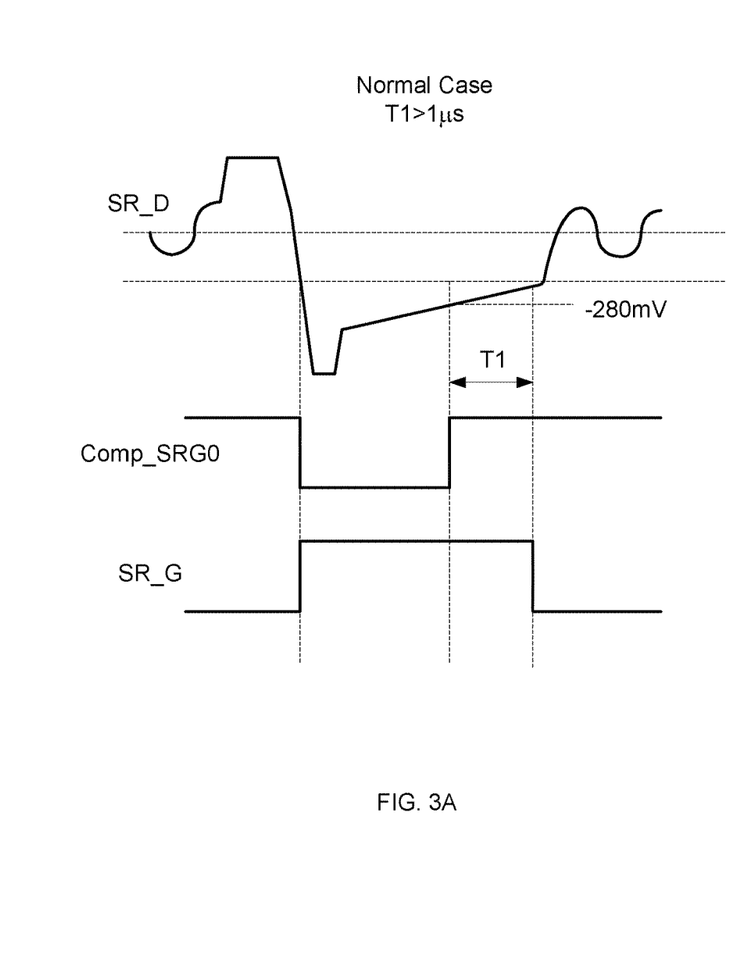
FIG. 3A illustrates some operating waveforms for the secondary-side controller of FIG. 2 during normal (no fault) operation.

Regardless of whether a detection period T between the crossing of the negative threshold voltage and the switching off of the SR switch transistor is measured in the digital domain as discussed with regard to timer 210 and logic circuit 230 or in the analog domain, a fault condition is detected in response to the detection period T being less than the threshold period. This may be better appreciated with reference to the example operating waveforms shown in FIGS. 3A and 3B. FIG. 3A shows the drain voltage waveform in relation to the comparator output signal Comp_SRGO and the SR_G terminal voltage waveforms in the absence of a fault condition (normal operation) for the SR switch transistor. Since the channel is operating normally, the body diode for the SR switch transistor is conducting negligible current such that the drain-to-source voltage for the SR switch transistor is not strongly negative while the SR switch transistor is conducting (the SR_G terminal voltage thus being charged high). The SR switch transistor begins conducting at a time T0. Since the source-to-drain voltage is not being pulled strongly negatively by a body diode conduction, the drain voltage crosses the negative threshold voltage of −280 mV at a time T1 that occurs well before (e.g., approximately 1 µs before) a time T2 when the SW switch transistor stops conducting. The detection period T in FIG. 3A is thus approximately 1 µs. This detection period T is the delay between the negative threshold voltage crossing at time T1 and the SR switch transistor switch-off at time T2.

Figure 3B:
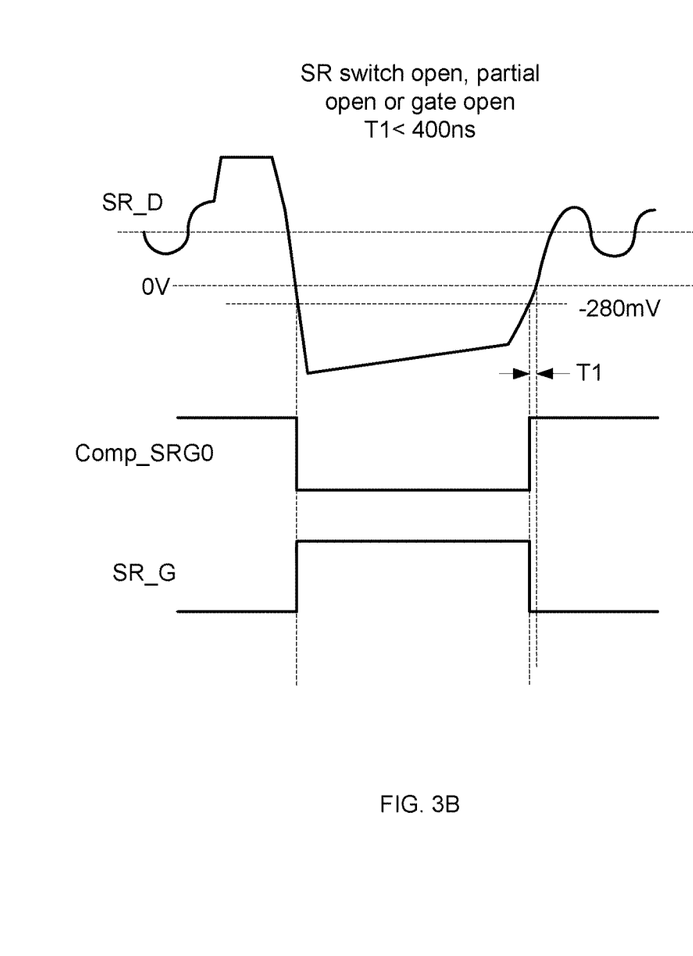
FIG. 3B illustrates some operating waveforms for the secondary-side controller of FIG. 2 during operation with a fault condition.

In contrast, the SR switch transistor has a partially-open fault (or open fault) condition in the waveforms of FIG. 3B. In FIG. 3B, the SR switch transistor is again switched on at a time T0 and switched off at a time T2. But since the drain-to-source voltage is being pulled more strongly negative due to the body diode conduction caused by the fault condition, the drain voltage only rises above the negative threshold voltage at a time T1 that occurs just before time T2. The detection period T in FIG. 3B is thus relatively short, e.g., approximately 400 ns.

Referring again to FIG. 1, SR controller 120 may respond to the fault detection by stopping the cycling of the power switch transistor SW. For example, SR controller 120 could communicate the detection of the partially-open/open fault condition by a transmission of an alarm signal through the ground-isolating channel 125 such as an optoisolator or a digital isolator. In addition (or alternatively), SR controller 120 may notify a user of the fault detection such as by communicating the detection of the fault through a USB cable being used to charge a cellular telephone.

Figure 4:
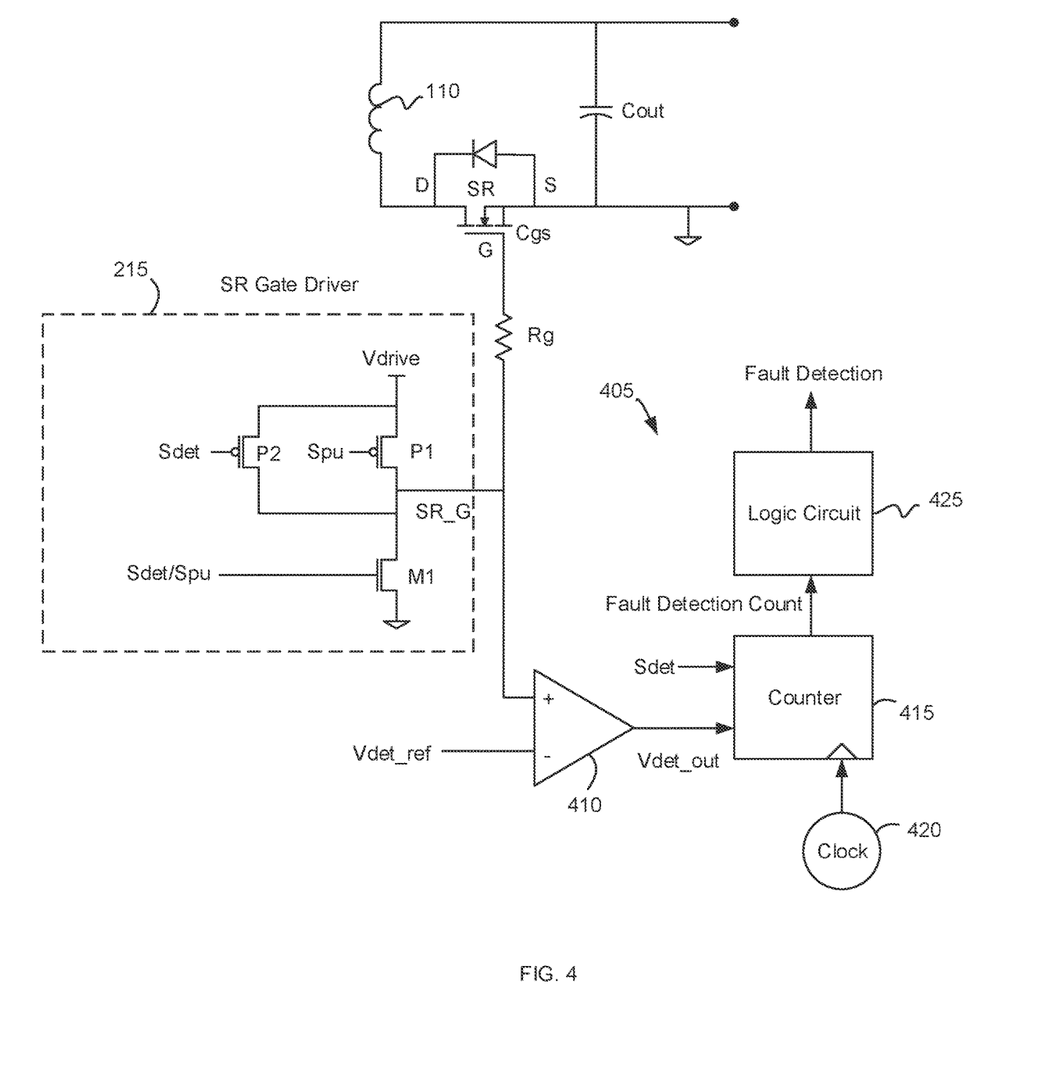
FIG. 4 illustrates the gate terminal voltage monitoring features of the secondary-side controller of FIG. 1 for the detection of the gate open and the gate short-circuit fault conditions in accordance with an aspect of the disclosure.

The gate drive voltage monitoring features for SR controller 120 for the detection of a gate open fault condition and/or a gate short-circuit fault condition are shown in FIG. 4. SR gate driver 215 includes a pull-up PMOS transistor P1 having a source connected to a power supply node for a power supply voltage Vdrive and a drain connected to the gate terminal SR_G. SR gate driver 215 also includes a pull-down NMOS transistor M1 having a source connected to ground and a drain connected to the gate terminal SR_G. During normal operation, an active-low pull-up signal Spu drives the gates of transistors P1 and M1 to control whether the SR switch transistor is on or off. When the SR switch transistor is to be switched on, the pull-up signal Spu is discharged to switch on the pull-up transistor P1 to charge the gate terminal SR_G to the power supply voltage Vdrive. The discharging of the pull-up signal Spu switches off the pull-down transistor M1. When the SR switch transistor is to be switched off, the pull-up signal Spu is charged to a controller power supply voltage to switch on the pull-down transistor M1 and to switch off the pull-up transistor P1. The switching on of the pull-down transistor M1 discharges the gate terminal SR_G to switch off the SR switch transistor.

To be able to detect the gate open or gate short-circuit fault conditions during normal operation, SR gate driver 215 also drives a fault detection circuit 405 that measures a detection period T2 that corresponds to a delay from when SR gate driver 215 begins a pull-up of the SR_G terminal voltage to when the SR_G terminal voltage crosses a positive threshold voltage Vdet_ref such as one-half the power supply voltage Vdrive. If the detection period T2 is too long as compared to a no-fault delay, a gate short-circuit fault condition is deemed to be detected. Conversely, if the detection period T2 is too short, a gate open fault condition is deemed to be detected.

The rise time of the SR_G terminal voltage as related to these fault conditions may be better appreciated through the following discussion. As seen in FIG. 4, the gate terminal SR_G of SR controller 120 connects to the gate (G) of the SR switch transistor through a gate resistor Rg. The SR switch transistor also has a gate-to-source capacitance Cgs between its gate G and its source S. During pull-up of the SR_G terminal, SR gate driver 215 has a pull-up resistance Rpu that includes an on-resistance of the pull-up transistor P1. Given these factors, it can be shown that the gate voltage as a function of time (Vg(t)) during the pull-up of the SR_G terminal may be expressed as:

$$Vg(t) = Vdrive(1 - e^{-t/\tau})$$

where the time constant τ equals (Rpu+Rg)*Cgs. Similarly, the SR_G terminal voltage as a function of time (VSR_G(t)) during the pull-up may be expressed as $$VSR\_G(t) = Vdrive\left(1 - \frac{Rpu}{Rpu + Rg}e^{-t/\tau}\right)$$

If the gate resistance Rg is appreciable compared to the pull-up resistance Rpu or even larger, the measurement of the detection period T2 becomes problematic due to the resulting rapid increase in the SR_G terminal voltage. To ease the measurement of the detection period T2, SR gate driver 215 may include a second pull-up PMOS transistor P2 arranged in parallel with pull-up transistor P1. A fault detection active-low pull-up signal Sdet controls the gate of PMOS transistor P2 and pull-down transistor M1 during a fault detection mode. Pull-up transistor P2 is sized to be several times smaller than pull-up transistor P1 so that a detection pull-up resistance Rdet of SR gate driver 215 during a fault detection mode of operation is several times larger than pull-up resistance Rpu. During a fault measurement, pull-up transistor P1 is not used but instead it is pull-up transistor P2 that does the charging of the gate terminal SR_G voltage. The SR_G terminal voltage as a function of time (VSR_G(t)) during the pull-up in the fault detection mode may thus be expressed as $$VSR\_G(t) = Vdrive\left(1 - \frac{Rdet}{Rdet + Rg}e^{-t/\tau1}\right)$$

where the time constant τ1 equals (Rdet+Rg)*Cgs. Time constant τ1 is greater than time constant τ to slow the increase in the SR_G terminal voltage. In some applications, Rdet may be 20 or 30 ohms. Due to the relatively large resistance Rdet, the turn-on time for the SR switch transistor is increased but this increase is negligible since the default detection mode may be run relatively infrequently during operation. For example, the fault detection mode may be used to cycle on the SR switch transistor once every 1000 cycles.

Fault detection circuit 405 includes a counter or timer 415 that begins counting the detection period T2 responsive to cycles of a clock signal from a clock 420 when the fault detection active-low pull-up signal Sdet is asserted. A comparator 410 compare the SR_G terminal voltage to the positive threshold voltage Vdet_ref (e.g., one-half the power supply voltage Vdrive). When the SR_G terminal voltage rises to equal the positive threshold voltage Vdet_ref, comparator 410 asserts its output signal Vdet_out to stop counter 415 from counting. A logic circuit 425 then compares the resulting period T2 to a no-fault period range that extends from a minimum value (denoted as Tgood) to a maximum value (denoted as Tshort). It will be appreciated that timer 415 may also be implemented in the analog domain analogously as discussed for timer 210. If the period T2 is within the no-fault period range such that Tgood≤T2≥Tshort, then logic circuit 425 does not detect any faults. But if T2<Tgood or T2>Tshort, then logic circuit 425 asserts a fault detection signal. The minimum value may also be denoted herein as a second threshold period. Similarly, the maximum period Tshort may be denoted herein as a third threshold period. As discussed with regard to the detection of partially-open and open fault conditions, SR controller 120 may command a cessation of the cycling of the power switch transistor SW due to a detection of a gate open or gate short-circuit fault condition through a corresponding alarm signal transmitted through the isolating channel 125 (e.g., a command transmitted through an optoisolator). Similarly, SR controller 120 may notify a user of the detected fault through such as through a message transmitted through a USB cable to the user's smartphone.

Figure 5A:
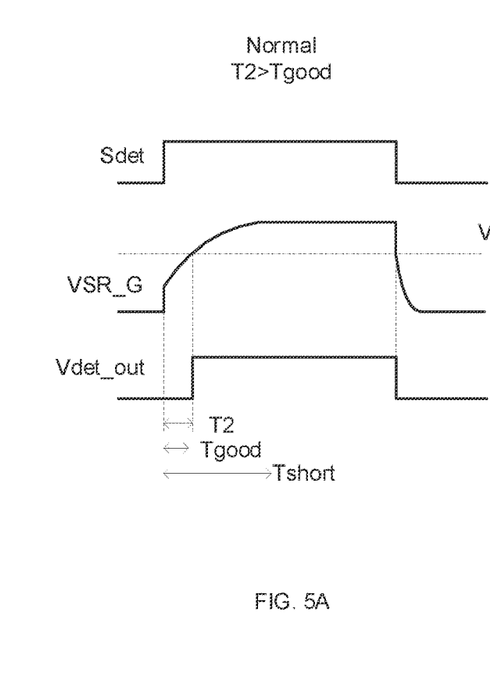
FIG. 5A illustrates some operating waveforms for the secondary-side controller of FIG. 4 during normal (no fault) operation.
Figure 5B:
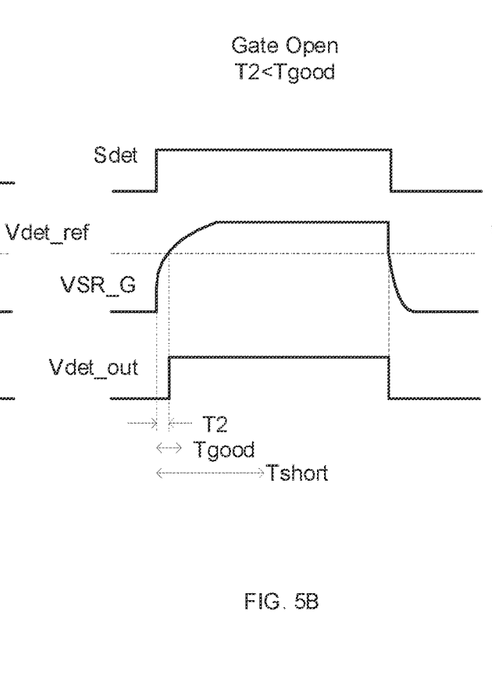
FIG. 5B illustrates some operating waveforms for the secondary-side controller of FIG. 4 during operation with a gate open fault condition.
Figure 5C:
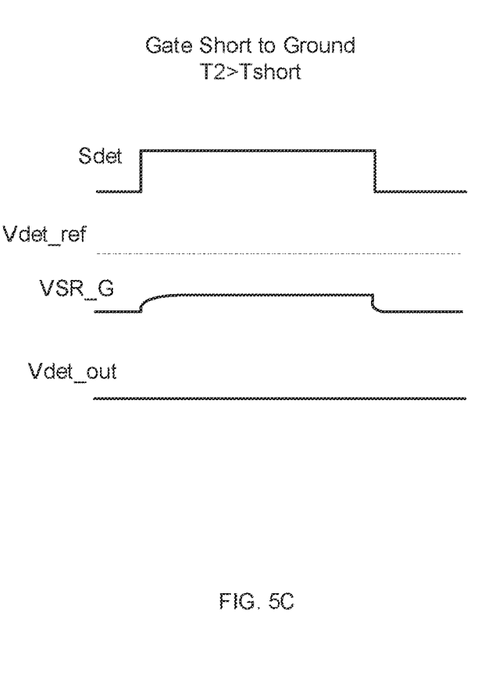
FIG. 5C illustrates some operating waveforms for the secondary-side controller of FIG. 4 during operation with a gate short-circuit fault condition.

Some example waveforms for the detection of gate open and gate short-circuit fault conditions by fault detection circuit 405 are shown in FIGS. 5A, 5B, and 5C. Although Sdet may be an active-low signal, it is shown as active-high in FIGS. 5A-5C for illustration purposes. The SR_G terminal voltage waveform is designated as VSR_G. In FIG. 5A, the assertion of the Vdet_out output signal from comparator 410 occurs after the assertion of the Sdet signal such that the detection period T2 is greater than the minimum period Tgood and less than the maximum period Tshort. FIG. 5A thus corresponds to normal operation in which no gate open or gate short-circuit condition is detected. In FIG. 5B, the assertion of the Vdet_out output signal occurs relatively quickly after the assertion of the Sdet signal such that the detection period T2 is less than the minimum period Tgood. FIG. 5B thus corresponds to a detection of a gate open fault condition. In FIG. 5C, the assertion of the Vdet_out output signal occurs relatively slowly after the assertion of the Sdet signal such that the detection period T2 is greater than the maximum period Tshort. FIG. 5C thus corresponds to a detection of a gate short-circuit fault condition. It will thus be appreciated that fault detection circuit 405 distinguishes between gate open fault conditions and gate short-circuit fault conditions. These fault conditions may thus be communicated using separate alarm signals so that a user may be alerted of the fault identity.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A secondary-side controller for a flyback converter, comprising:
    a gate driver for controlling a cycling of a synchronous rectifier switch transistor;
    a drain terminal for connecting to a drain of the synchronous rectifier switch transistor;
    a timer for timing a detection period beginning when the gate driver has switched on the synchronous rectifier switch transistor and ending when a voltage of the drain terminal exceeds a negative threshold voltage; and a logic circuit configured to compare the detection period to a threshold period to detect whether the synchronous rectifier switch transistor has a partially-open fault condition.

2. The secondary-side controller of claim 1, further comprising:
a comparator for comparing the voltage of the drain terminal to the negative threshold voltage to provide an output signal to the timer to stop timing the detection period responsive to the voltage of the drain terminal being greater than the negative threshold voltage.

3. The secondary-side controller of claim 2, wherein the timer is a counter that counts responsive to cycles of a clock signal.

4. The secondary-side controller of claim 2, wherein the timer is an analog circuit timer.

5. The secondary-side controller of claim 1, wherein the negative threshold voltage is an adaptive negative threshold voltage, the secondary-side controller further comprising:
a threshold adaptation circuit for adapting the adaptive negative threshold voltage.

6. The secondary-side controller of claim 5, wherein the threshold adaptation circuit is configured to adapt the adaptive negative threshold voltage responsive to an operating temperature of the flyback converter.

7. The secondary-side controller of claim 1, wherein the secondary-side controller is further configured to communicate an alarm signal to a primary-side controller responsive to a detection of the partially-open fault condition.

8. The secondary-side controller of claim 7, wherein the primary-side controller is configured to cease a cycling of a power switch transistor responsive to a receipt of the alarm signal.

9. The secondary-side controller of claim 1, wherein the negative threshold voltage is approximately −280 millivolts.

10. The secondary-side controller of claim 1, wherein the logic circuit is further configured to detect whether the synchronous rectifier switch transistor has the partially-open fault condition responsive to the detection period being less than the threshold period.

11. The secondary-side controller of claim 10, wherein the threshold period is approximately 1 µs.

12. A secondary-side controller for a flyback converter, comprising:
a gate driver for controlling a cycling of a synchronous rectifier switch transistor through a gate terminal;
a timer for timing a detection period beginning when the gate driver has switched on the synchronous rectifier switch transistor and ending when a voltage of the gate terminal exceeds a positive threshold voltage; and
a logic circuit configured to detect whether the synchronous rectifier switch transistor has a gate open fault condition responsive to the detection period being shorter than a first threshold period.

13. The secondary-side controller of claim 12, wherein the logic circuit is further configured to detect whether the synchronous rectifier switch transistor has a gate short-circuit fault condition responsive to the detection period being longer than a second threshold period, wherein the second threshold period is longer than the first threshold period.

14. The secondary-side controller of claim 12, wherein the gate driver includes:
a first pull-up transistor for charging the gate terminal during a normal operation in which the timer and the logic circuit are not active; and
a second pull-up transistor for charging the gate terminal during a fault detection mode of operation in which the timer and the logic circuit are both active, wherein a size of the second pull-up transistor is smaller than a size of the first pull-up transistor.

15. The secondary-side controller of claim 13, wherein the timer comprises a counter configured to count responsive to cycles of a clock signal.

16. The secondary-side controller of claim 13, wherein the logic circuit is further configured to assert a first alarm signal responsive to a detection of the gate open fault condition and to assert a second alarm signal responsive to a detection of the gate short-circuit fault condition.

17. The secondary-side controller of claim 14, wherein the first pull-up transistor and the second pull-up transistor are both PMOS transistors.

18. A method of detecting a fault condition for a synchronous rectifier switch transistor in a flyback converter, comprising;
switching on the synchronous rectifier switch transistor;
while the synchronous rectifier switch transistor is on, beginning a timing of a first detection period responsive to a drain-to-source voltage of the synchronous rectifier switch transistor being greater than a negative threshold voltage;
ending the timing of the first detection period responsive to switching off of the synchronous rectifier switch transistor; and
detecting a partially-open fault condition for the synchronous rectifier switch transistor responsive to the first detection period being shorter than a first threshold period.

19. The method of claim 18, wherein the switching on of the synchronous rectifier switch transistor comprises a charging of a gate terminal coupled to a gate of the synchronous rectifier switch transistor, the method further comprising:
beginning a timing of a second detection period responsive to the switching on of the synchronous rectifier switch transistor;
ending a timing of the second detection period responsive to a voltage of the gate terminal exceeding a positive threshold voltage;
detecting a gate open fault condition for the synchronous rectifier switch transistor responsive to the second detection period being less than a second threshold period; and
detecting a gate short-circuit fault condition for the synchronous rectifier switch transistor responsive to the second detection period being greater than a third threshold period, wherein the third threshold period is longer than the second threshold period.

20. The method of claim 19, wherein the positive threshold voltage is approximately one-half of a power supply voltage for a gate driver.

* * * * *